(12) United States Patent
Nakanishi et al.

(10) Patent No.: US 6,884,643 B2
(45) Date of Patent: Apr. 26, 2005

(54) SEMICONDUCTOR DEVICE, METHOD FOR EVALUATING THE SAME, AND METHOD FOR FABRICATING THE SAME

(75) Inventors: Kentaro Nakanishi, Nara (JP); Hiroaki Nakaoka, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 129 days.

(21) Appl. No.: 10/370,079

(22) Filed: Feb. 21, 2003

(65) Prior Publication Data

US 2004/0031997 A1 Feb. 19, 2004

(30) Foreign Application Priority Data

Feb. 21, 2002 (JP) .......................................... 2002-044453

(51) Int. Cl.[7] .............................................. G01R 31/26
(52) U.S. Cl. .......................................... 438/17; 438/18
(58) Field of Search ...................................... 438/17, 18

(56) References Cited

U.S. PATENT DOCUMENTS 6,570,228 B1 * 5/2003 Fuselier et al. ............. 257/368

* cited by examiner

*Primary Examiner*—Douglas Wille
(74) *Attorney, Agent, or Firm*—McDermott Will & Emery LLP (57) ABSTRACT

Semiconductor devices each having a semiconductor layer (1), a gate insulating film (2), a gate electrode (3), an offset spacer layer (4), and SD extension diffusion layers (6) into which ions have been implanted by using the gate electrode (3) and the offset spacer layer (4) as a mask are formed by varying the film thickness of the offset spacer layer (4) and leakage current values in the respective semiconductor devices are measured. The results of the measurements show that the film thickness value of the offset spacer layer (4) and the leakage current value have a correlation therebetween and that the film thickness value of the offset spacer layer (4) when the leakage current value becomes zero corresponds to the length of the portion of the semiconductor layer (1) extending from under the outer end of the offset spacer layer (4) to the tip end of an impurity diffusion layer.

9 Claims, 9 Drawing Sheets

| Tox1 | Ig1 (A/$\mu m^2$) |
|---|---|
| 19.0 | 8.0E-09 |
| 19.5 | 5.5E-09 |
| 20.0 | 3.5E-09 |
| 20.5 | 2.0E-09 |
| 21.0 | 1.0E-09 |

| Chip under Measurement | Ig2 (A/$\mu m^2$) | Tox2 (A) |
|---|---|---|
| A | 5.00E-09 | 19.6 |
| B | 3.80E-09 | 19.8 |
| C | 3.00E-09 | 20.0 |
| D | 2.50E-09 | 20.2 |
| E | 2.30E-09 | 20.3 |
| F | 2.60E-09 | 20.2 |
| G | 2.10E-09 | 20.4 |
| H | 3.50E-09 | 19.9 |
| I | 4.50E-09 | 19.7 |

FIG. 9

| Chip under Measurement | Ig3 (A) | Lg ($\mu m$) |
|---|---|---|
| A | 5.00E-09 | 0.100 |
| B | 3.91E-09 | 0.103 |
| C | 3.03E-09 | 0.101 |
| D | 2.45E-09 | 0.098 |
| E | 2.19E-09 | 0.095 |
| F | 2.63E-09 | 0.101 |
| G | 2.21E-09 | 0.105 |
| H | 3.57E-09 | 0.102 |
| I | 4.46E-09 | 0.099 |

| Tox (A) | Ig4 (A/μm²) |
|---|---|
| 21.0 | 1.0E-09 |
| 21.5 | 6.7E-10 |
| 22.0 | 4.0E-10 |
| 22.5 | 2.4E-10 |
| 23.0 | 1.4E-10 |

FIG. 12

| Ls (nm) | Ig6 (A/μm) |
|---|---|
| 8 | 3.8E-11 |
| 9 | 3.3E-11 |
| 10 | 2.7E-11 |
| 11 | 2.3E-11 |
| 12 | 1.8E-11 |

SEMICONDUCTOR DEVICE, METHOD FOR EVALUATING THE SAME, AND METHOD FOR FABRICATING THE SAME

BACKGROUND OF THE INVENTION

The present invention relates to a semiconductor device, to a method for evaluating the same, and to a method for fabricating the same by using the evaluation method.

Conventionally, the evaluation of an impurity profile has been performed by using a SIMS method which analyzes secondary electrons liberated from a sample upon the application of ions for analysis (primary ions).

The dimensions of a gate electrode in a semiconductor device have been measured after patterning for forming the gate electrode by using a system termed a critical dimension measurement SEM.

In a conventional method for fabricating a semiconductor device, on the other hand, the formation of a gate insulating film and the control of the film thickness of an offset spacer layer, which allows an amount of overlapping between the gate electrode and an impurity diffusion layer to be adjusted, have been performed by forming a monitor wafer and measuring a film thickness. In general, film thickness control has been performed also in another film forming step by measuring a film thickness on the monitor wafer.

However, the following problems are encountered by the conventional methods for evaluating and fabricating a semiconductor device.

If a SIMS method is used in a method for evaluating an impurity profile, it is difficult to evaluate an amount of horizontal expansion of the impurity profile since the SIMS method is implemented while grating a sample.

If critical dimension measurement SEM is used in a method for evaluating a gate electrode, an extremely long period of time is required since the dimensions of each of the gate electrode should be measured individually. If a gate electrode is evaluated in the course of the process of fabricating a semiconductor device, therefore, it is difficult to evaluate a sufficiently large number of samples. If overall evaluation is performed by measuring a limited portion of a gate electrode for a reduced measurement time, errors resulting from variations in the finished configuration of the gate electrode may occur.

If the film thickness control is performed only by measuring a film thickness on the monitor wafer in the steps of forming a gate insulating film and an offset spacer layer, unexpected impurity contamination, variations in the fabrication process, or the like may be unrecognized and a defect may occur in the semiconductor device since measurement is not performed in the semiconductor device for actual operation.

SUMMARY OF THE INVENTION

It is therefore an object of the present invention to provide a semiconductor device with high reliability, a method for evaluating the same, and a method for fabricating the same by providing means for solving the foregoing problems.

A semiconductor device according to the present invention comprises: a semiconductor layer; a gate insulating film provided on the semiconductor layer; a gate electrode provided on the gate insulating film; a monitor insulating film provided on the semiconductor layer, the monitor insulating film being formed from a film from which the gate insulating film is formed to have an area larger than an area of the gate insulating film; and a monitor electrode provided on the monitor insulating film.

The arrangement allows the thickness of a gate insulating film with a reduced error to be obtained from a leakage current measured in the monitor region composed of the monitor insulating film and the monitor electrode based on a correlation between leakage current and thickness of insulating film. The arrangement also allows the dimensions of the gate electrode with a reduced error to be obtained by comparing the leakage current measured in the gate electrode and the gate insulating film with the leakage current in the monitor region.

Preferably, the area of the monitor insulating film is 100 times the area of the gate insulating film or more.

A first method for evaluating a semiconductor device according to the present invention is a method for evaluating a semiconductor device having a gate insulating film provided on a semiconductor layer, a gate electrode provided on the gate insulating film, an offset spacer layer provided on a side surface of the gate electrode, and an impurity diffusion layer formed in the semiconductor layer by using the gate electrode and the offset spacer layer as at least part of a mask, the method comprising the steps of: (a) measuring a plurality of leakage currents by using a plurality of semiconductor devices having the offset spacer layers with different film thicknesses; and (b) calculating a correlation between leakage current and film thickness of offset spacer layer based on the plurality of leakage currents.

The arrangement allows the horizontal distribution of an impurity in the impurity diffusion layer to be obtained by using the correlation between leakage current and film thickness of offset spacer layer and thereby allows more accurate evaluation of the semiconductor device.

The step (b) can include calculating a film thickness value of the offset spacer layer when the leakage current value is zero based on the correlation and regarding the film thickness value as a length of a portion of the semiconductor layer extending from under an outer end of the offset spacer layer to an inner tip end of the impurity diffusion layer.

A second method for evaluating a semiconductor device according to the present invention is a method for evaluating a semiconductor device comprising an actual transistor region having a semiconductor layer, a gate electrode, and a gate insulating film interposed between the semiconductor layer and the gate electrode and a monitor region having a monitor electrode and a monitor insulating film, the monitor insulating film being provided between the semiconductor layer and the monitor electrode and formed from a film from which the gate insulating film is formed to have an area larger than an area of the gate insulating film, the method comprising the steps of: (a) measuring a leakage current in the monitor region; (b) calculating, from the leakage current, a thickness of the monitor insulating film based on a predetermined correlation between leakage current and thickness of insulating film; and (c) regarding the thickness of the monitor insulating film as a thickness of the gate insulating film.

Since the leakage current is measured by using the monitor insulating film having the area larger than that of the gate insulating film, an error in the calculated thickness of the gate insulating film can be reduced. This allows a more accurate thickness of the gate insulating film to be obtained.

The method may further comprise, prior to the step (b), the steps of: (d) measuring a plurality of leakage currents by using a plurality of regions having insulating films with different thicknesses and electrodes; and (e) calculating a correlation between leakage current and thickness of insulating film based on the plurality of leakage currents.

Preferably, the area of the monitor insulating film is 100 times the area of the gate insulating film or more.

A third method for evaluating a semiconductor device according to the present invention is a method for evaluating a semiconductor device comprising an actual transistor region having a semiconductor layer, a gate electrode, and a gate insulating film interposed between the semiconductor layer and the gate electrode and a monitor region having a monitor electrode and a monitor insulating film, the monitor insulating film being provided between the semiconductor layer and the monitor electrode and formed from a film from which the gate insulating film is formed to have an area larger than an area of the gate insulating film, the method comprising the steps of: (a) measuring a leakage current in the monitor region; (b) measuring a leakage current in the actual transistor region; and (c) comparing the leakage currents measured in the respective steps (a) and (b) with each other and calculating a dimension of the gate electrode in the actual transistor region.

The arrangement allows the dimension of the gate electrode with a reduced error to be calculated based on the leakage current measured in the large-area monitor region in which an area error can be ignored.

Preferably, the area of the monitor insulating film is 100 times the area of the gate insulating film or more.

A first method for fabricating a semiconductor device according to the present invention comprises the steps of: (a) forming a gate insulating film and a gate electrode on an actual transistor region of a semiconductor layer, while forming a monitor insulating film and a monitor electrode on a monitor region of the semiconductor layer, the monitor insulating film being formed from a film from which the gate insulating film is formed to have an area larger than an area of the gate insulating film; (b) measuring a leakage current in the monitor region; and (c) comparing the leakage current measured in the step (b) with a normalized value based on a correlation between leakage current and thickness of insulating film to judge whether or not the gate insulating film formed in the step (a) is proper.

Since the arrangement judges the leakage current measured by using the monitor insulating film having the area larger than that of the gate insulating film, more accurate judgment can be performed. Since it is possible to judge whether or not a process is proper in the course of the process steps, a cost reduction is achievable.

The correlation between leakage current and thickness of insulating film may be obtained by measuring a plurality of leakage currents by using a plurality of regions each having a semiconductor layer, an electrode, and an insulating film interposed between the semiconductor layer and the electrode and having a known thickness.

Preferably, the area of the monitor insulating film is 100 times the area of the gate insulating film or more.

A second method for fabricating a semiconductor device according to the present invention comprises the steps of: (a) forming a gate insulating film and a gate electrode on an actual transistor region of a semiconductor layer, while forming a monitor insulating film and a monitor electrode on a monitor region of the semiconductor layer, the monitor insulating film being formed from a film from which the gate insulating film is formed to have an area larger than an area of the gate insulating film; (b) measuring a leakage current in the monitor region; (c) measuring a leakage current in the actual transistor region; and (d) comparing the leakage currents measured in the respective steps (a) and (b) with each other to judge whether or not a dimension of the gate electrode is proper.

Since the arrangement performs judgment based on the leakage current measured in the large-area monitor region having a large area in which an area error can be ignored, more accurate judgment can be performed. Since it is possible to judge whether or not a process is proper in the course of the process steps, a cost reduction is achievable.

Preferably, the area of the monitor insulating film is 100 times the area of the gate insulating film or more.

A third method for fabricating a semiconductor device according to the present invention comprises the steps of: (a) forming a gate insulating film and a gate electrode on a semiconductor layer; (b) forming an offset spacer layer on a side surface of the gate electrode; (c) after the step (b), ion-implanting an impurity into a portion of the semiconductor layer by using, as a mask, the gate electrode and the offset spacer layer; (d) after the step (c), measuring a leakage current between the gate electrode and the semiconductor layer; and (e) comparing the leakage current with a normalized value to judge whether or not a horizontal length of a portion of the semiconductor layer extending from under an outer end of the offset spacer layer to a tip end of a region of the semiconductor layer in which the impurity implanted in the step (c) is diffused is proper.

The arrangement allows judgment of whether or not the horizontal distribution of the impurity is proper in the course of the fabrication process, the reliability of the fabrication process can be increased and a cost reduction can be achieved.

A fourth evaluation method according to the present invention is a method for evaluating a semiconductor device having an actual operating element comprising a gate insulating film provided on a semiconductor layer, a gate electrode provided on the gate insulating film, an offset spacer layer provided on a side surface of the gate electrode, and an impurity diffusion layer formed in the semiconductor layer by using the gate electrode and the offset spacer layer as at least part of a mask, the method comprising the steps of: (a) measuring respective leakage currents in some of a plurality of reference elements having respective reference offset spacer layers with different film thicknesses; (b) calculating a correlation between leakage current and film thickness of reference offset spacer layer based on the respective leakage currents in the reference elements; and (c) evaluating, based on the correlation, a length of a portion of the semiconductor layer extending from under an outer end of the offset spacer layer to the impurity diffusion layer in the actual operating element.

Since the arrangement allows the horizontal distribution of the impurity in the impurity diffusion layer of the actual operating element to be obtained, the semiconductor device can be evaluated more accurately.

The step (b) can include calculating, based on the correlation, the film thickness value of each of the reference offset spacer layers when the reference leakage current has a zero value and the step (c) can include regarding the film thickness value as the length of the portion of the semiconductor layer extending from under the outer end of the offset spacer layer to a tip end of the impurity diffusion layer in the actual operating element.

A wafer formed with the actual operating element is provided with an actual transistor region in which the actual operating element is provided and with a monitor region having a monitor insulating film and a monitor electrode, the monitor insulating film being formed from a film from which the gate insulating film is formed to have an area larger than an area of the gate insulating film, the method further comprising the steps of: (d) prior to the step (a), after the gate insulating film of the actual operating element and the gate electrode thereof are formed and before the impurity diffusion layer is formed, measuring a leakage current in the monitor region; (e) calculating a thickness of the monitor insulating film based on a correlation between the leakage current and the monitor insulating film in the monitor region; and (f) regarding the thickness of the monitor insulating film as a thickness of the gate insulating film of the actual operating element. The arrangement reduces an error in the calculated thickness value of the gate insulating film and allows a more accurate thickness of the gate insulating film to be obtained.

The method may further comprise the steps of: (g) prior to the step (e), measuring respective leakage currents in some of a plurality of reference regions having respective reference insulating films with different thicknesses; and (h) calculating, based on the respective leakage currents in the reference regions, a correlation between leakage current and thickness of reference insulating film.

The method further comprises the steps of: (i) measuring a leakage current in the actual transistor region; and (j) comparing the leakage current measured in the step (i) with the leakage current measured in the step (g) to calculate a dimension of the gate electrode of the actual operating element. The arrangement allows a more accurate dimension of the gate electrode to be obtained based on the leakage current measured in the large-area monitor region in which an area error is ignorable.

Preferably, the area of the monitor insulating film is 100 times the area of the gate insulating film or more.

DETAILED DESCRIPTION OF THE INVENTION

Embodiment 1

Figure 1:
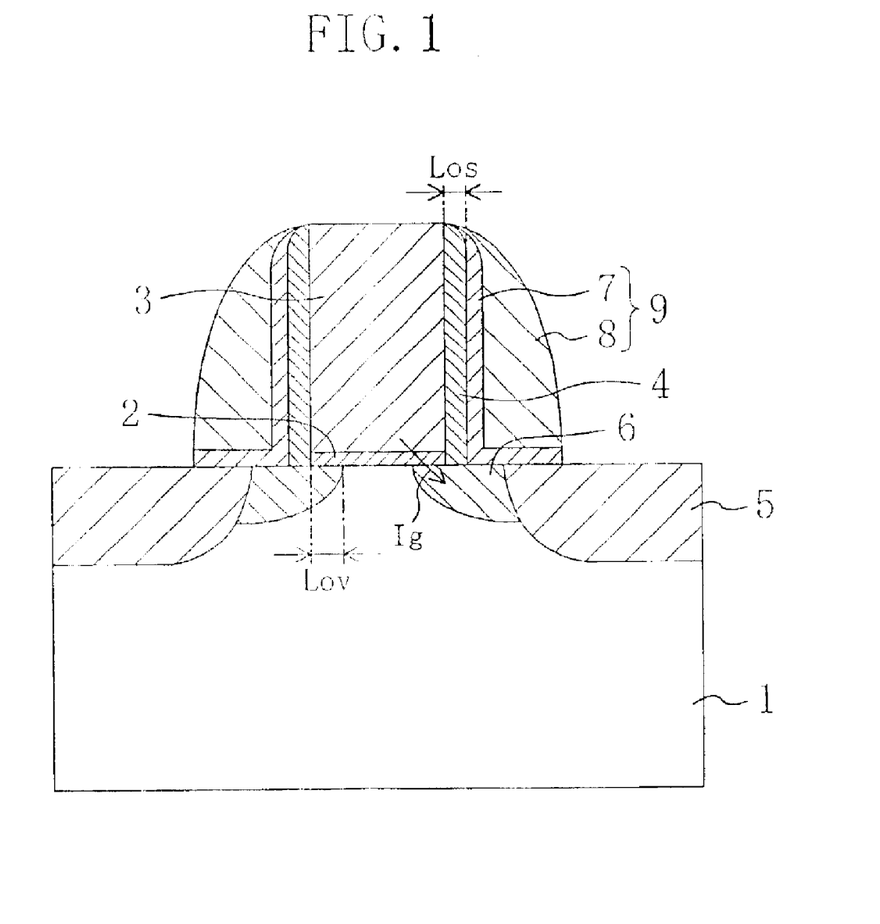
FIG. 1 is a cross-sectional view showing a structure of a semiconductor device according to a first embodiment of the present invention.

FIG. 1 is a cross-sectional view showing a structure of a semiconductor device according to a first embodiment of the present invention. As shown in FIG. 1, the semiconductor device according to the present embodiment is constituted by: a semiconductor layer 1; a gate insulating film 2; a gate electrode 3; an offset spacer layer 4 formed on the side surfaces of the gate insulating film 2 and the gate electrode 3; a sidewall 9 consisting of a TEOS film (silicon oxide film) 7 and a SiN film (silicon nitride film) 8 and formed to cover the side surfaces of the offset spacer layer 4 and part of the semiconductor layer 1; source/drain diffusion layers 5 formed in the portion of the semiconductor layer 1 located on both sides of the gate electrode 3; and SD (source/drain) extension diffusion layers 6.

Figure 2A:
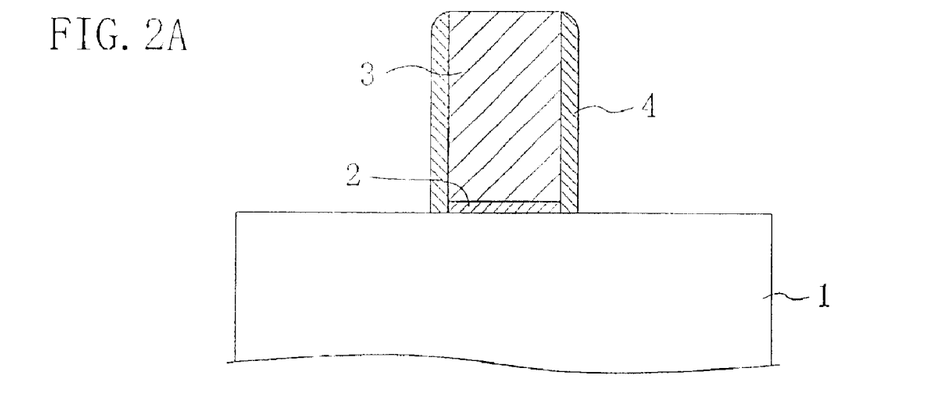
FIGS. 2A to 2C are cross-sectional views illustrating a method for fabricating the semiconductor device according to the first embodiment.
Figure 2B:
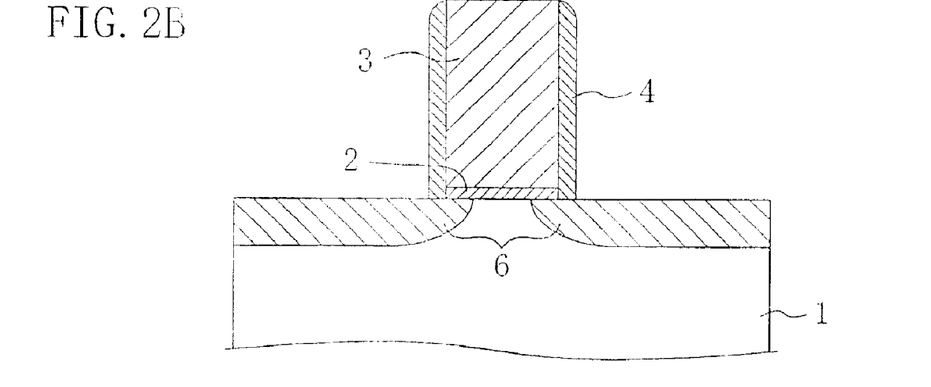
Figure 2C:
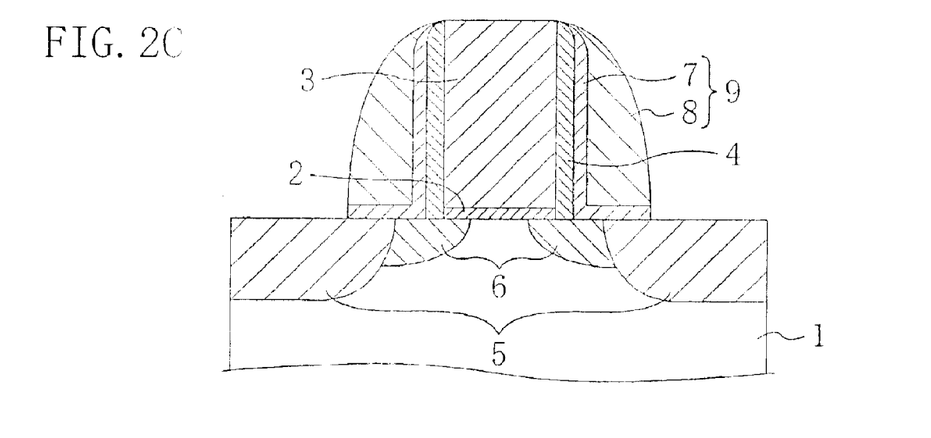

FIGS. 2A to 2C are cross-sectional views illustrating a method for fabricating the semiconductor device according to the first embodiment.

First, in the step shown in FIG. 2A, an oxide film with a thickness of 2.2 nm and a polysilicon film with a thickness of 160 nm are formed on a p-type semiconductor layer 1 and patterned to form the gate insulating film 2 and the gate electrode 3 each having a gate length of 0.1 $\mu$m. Thereafter, a HTO (High Temperature Oxide) film with a thickness of 14 nm is deposited on the substrate and the entire surface of the HTO film is etched by anisotropic dry etching so that the offset spacer layer 4 composed of the HTO film is formed only on the respective side surfaces of the gate insulating film 2 and the gate electrode 3.

Next, in the step shown in FIG. 2B, As as an n-type impurity is ion-implanted by using the gate electrode 3 and the offset spacer layer 4 as a mask so that the SD extension diffusion layers 6 are formed in part of the semiconductor layer 1. Implant conditions are such that an implant energy is 3 KeV and a dose is $1.5 \times 10^{15}$ cm$^{-2}$.

Next, in the step shown in FIG. 2C, the TEOS film with a thickness of 10 nm and the SiN film with a thickness of 60 nm are formed on the substrate. Then, the entire surfaces of the TEOS film and the SiN film are etched by anisotropic dry etching so that the sidewall 9 composed of the TEOS film 7 and the SiN film 8 is formed to cover the side surfaces of the offset spacer layer 4 and part of the semiconductor layer 1.

Then, As is ion-implanted by using the gate insulating film 2, the gate electrode 3, the offset spacer layer 4, and the sidewall 9 as a mask so that the source/drain diffusion layers 5 are formed in part of the semiconductor layer 1. Implant conditions are such that an implant energy is 50 KeV, a dose is $4 \times 10^{15}$ cm$^{-2}$, and an implant angle is 0 degree.

By performing a short-time heat treatment at 975° C. for 30 seconds, the impurity contained in the SD extension diffusion layers 6 and the source/drain diffusion layers 5 is activated. By the foregoing steps, the semiconductor device according to the present embodiment is formed.

Figure 3:
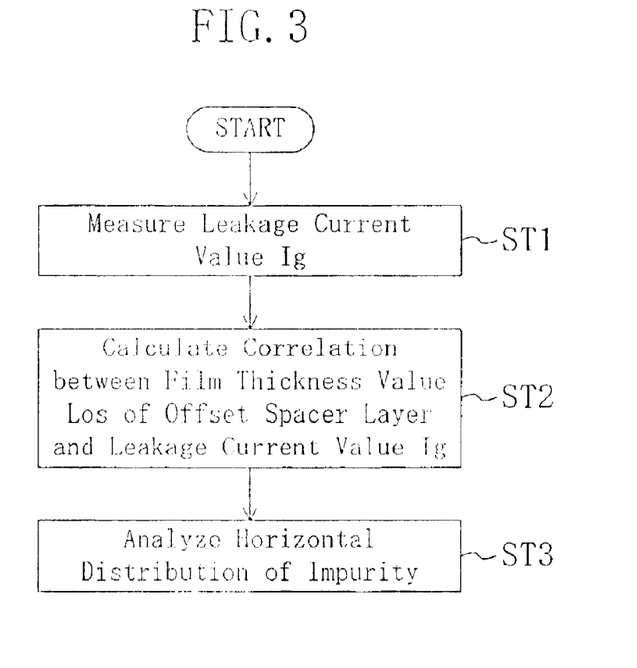
FIG. 3 is a flow chart illustrating a method for evaluating the semiconductor device according to the first embodiment.

A description will be given herein below to a method for evaluating the semiconductor device according to the present embodiment with reference to FIGS. 1, 3, and 4. FIG. 3 is a flow chart illustrating the method for evaluating the semiconductor device according to the first embodiment. Measurements are performed in the semiconductor device after the source/drain diffusion layers 5 were formed in the step shown in FIG. 2C.

First, in Step ST1 shown in FIG. 3, leakage current values Ig flowing from the gate electrodes 3 to the SD extension diffusion layers 6 are measured by using a plurality of the semiconductor devices having the offset spacer layers 4 with different film thicknesses (Vg=0 V, Vd=1.2 V). A leakage current value Ig measured under such conditions was $2.7 \times 10^{-11}$ A/$\mu$m (Ig=$2.7 \times 10^{-11}$ A/$\mu$m) when the film thickness value Los of the offset spacer layer 4 was 10 nm (Los=10 nm).

Figure 4:
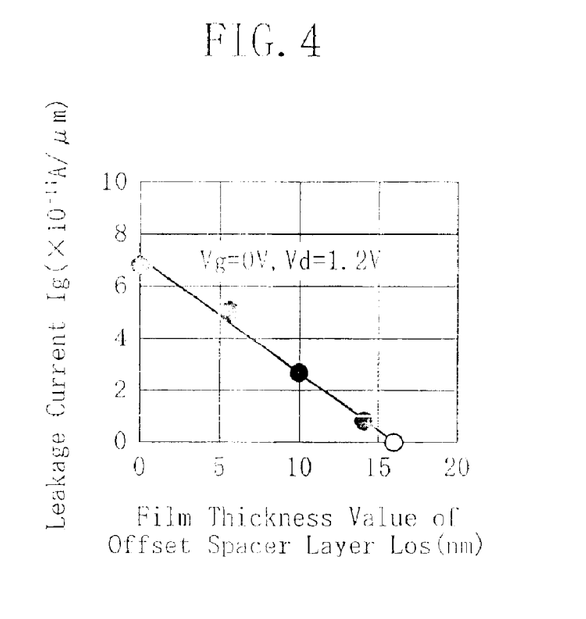
FIG. 4 is a graph showing the relationship between the film thickness value Los of an offset spacer layer 4 and a leakage current value Ig in the semiconductor device according to the first embodiment.

Next, in Step ST2, a correlation between the leakage current value Ig and the film thickness of the offset spacer layer 4 as shown in FIG. 4 is calculated. FIG. 4 is a graph showing the leakage current value Ig and the film thickness value Los of the offset spacer layer 4 in the first embodiment.

As shown in FIG. 4, the film thickness value Los of the offset spacer layer 4 and the leakage current value Ig has a correlation therebetween (correlation between leakage current and thickness of offset spacer layer) in the method for evaluating the semiconductor device according to the present embodiment. It will be understood that, if the film thickness value Los of the offset spacer layer 4 increases, the leakage current value Ig decreases linearly.

Next, in Step ST3, the horizontal distribution of the impurity in the semiconductor layer 1 is analyzed. Specific analysis will be described herein below.

As can be seen from FIG. 4, the leakage current value Ig becomes zero (Ig=0) when the film thickness value Los of the offset spacer layer 4 becomes about 16 nm. On the other hand, it can be considered that an amount Lov of overlapping between the gate electrode 3 and the SD extension diffusion layer 6 becomes zero when the leakage current value Ig becomes zero (Ig=0).

From the foregoing, it can be said that the amount Lov of overlapping becomes zero when the film thickness value Los of the offset spacer layer 4 is about 16 nm. If the SD extension diffusion layer 6 is formed under conditions as shown above, the length of the portion of the semiconductor layer 1 extending from under the outer end of the offset spacer layer 4 to the tip end (inner end) of the impurity diffusion layer can therefore be estimated to be about 16 nm. By the foregoing evaluation method, the horizontal distribution of the impurity can be obtained.

The method for evaluating an impurity profile in the semiconductor device according to the present embodiment allows the evaluation of a horizontal impurity profile, which has been difficult to perform in accordance with a conventional evaluation method using a SIMS method. Since the film thickness of the offset spacer layer 4 can be controlled on a per nanometer basis, evaluation can be performed with high accuracy.

Although the foregoing embodiment has performed evaluation by measuring the leakage current value Ig after the formation of the source/drain diffusion layers 5, the present invention is not limited thereto. It is also possible to form the SD extension diffusion layers 6 and then measure the leakage current values Ig prior to the formation of the source/drain diffusion layers 5.

Embodiment 2

Figure 5A:
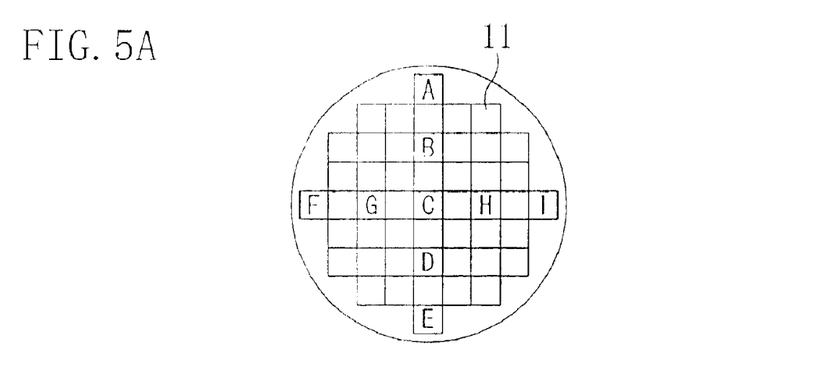
FIGS. 5A to 5C are plan views each showing respective structures of a semiconductor device under evaluation and a reference region according to a second embodiment of the present invention.
Figure 5B:
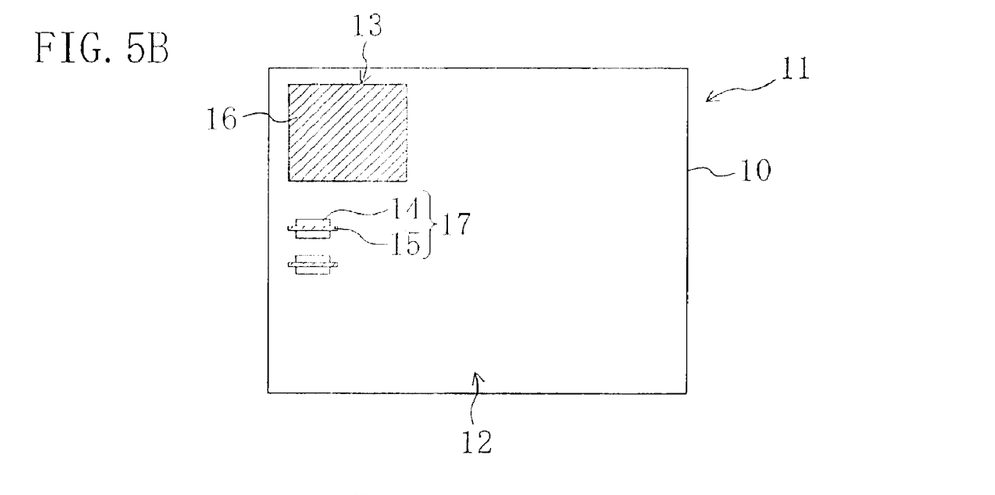
Figure 5C:
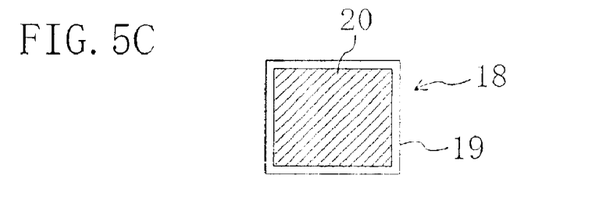

A method for evaluating a semiconductor device according to the present embodiment uses a wafer (semiconductor layer) under evaluation and a reference region provided outside the wafer under evaluation. A description will be given first to the respective structures of the wafer under evaluation and the reference region with reference to FIGS. 5A to 5C. FIGS. 5A to 5C are plan views showing the structures of the semiconductor device under evaluation and the reference region according to the second embodiment.

As shown in FIG. 5A, the wafer under evaluation is composed of a plurality of chips 11 under evaluation. As shown in FIG. 5B, each of the chips 11 under evaluation is divided into an actual transistor region 12 and a monitor region 13. The actual transistor region 12 is provided with a gate electrode 15 formed on a substrate 10 with a gate insulating film (not shown) interposed therebetween and with a transistor 17 having source/drain diffusion layers 14. The monitor region 13 is provided with a monitor insulating film (not shown) formed on the substrate 10 from the insulating film from which the gate insulating film of the transistor 17 is formed and with a monitor electrode 16 formed from the conductor film from which the gate electrode 15 of the transistor 17 is formed to have an area of 100 nm×100 nm.

Preferably, the monitor electrode 16 is formed such that the area of the monitor insulating film is 100 times the area of the gate insulating film of the transistor 17 or more.

On the other hand, as shown in FIG. 5C, the reference region 18 is constituted by a semiconductor layer 19, a reference insulating film (not shown) provided on the semiconductor layer 19 and having a known thickness, and a reference electrode 20 provided on the reference insulating film and having an area of 100 nm×100 nm. Each of the reference insulating film and the reference electrode 20 is composed of a film formed under the same conditions used to form the gate insulating film and gate electrode 15 of the transistor 17.

Figure 6:
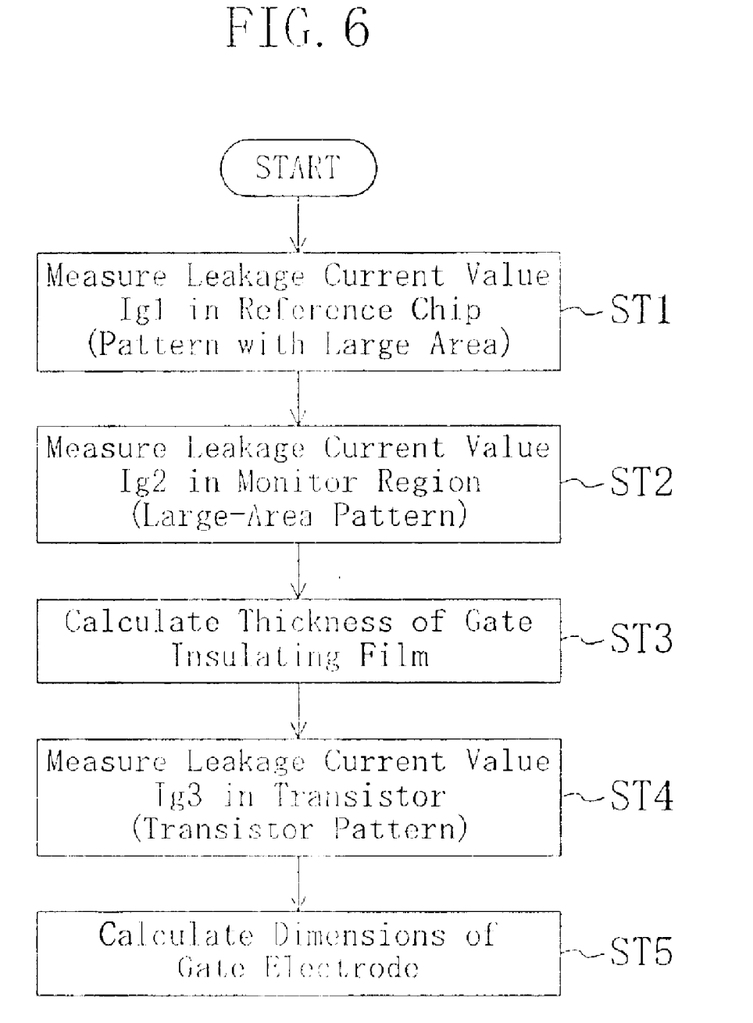
FIG. 6 is a flow chart illustrating a method for evaluating the semiconductor device according to the second embodiment.

A description will be given next to the method for evaluating a semiconductor device as shown in FIGS. 5A and 5B with reference to FIGS. 5A and 5B and FIG. 6. FIG. 6 is a flow chart illustrating the method for evaluating a semiconductor device according to the second embodiment. It is to be noted that Steps ST1 to ST5 in FIG. 6 are performed before ion implantation for the source/drain diffusion layers 14 is performed after the gate insulating film and gate electrode 15 of the actual transistor region 12 and the monitor insulating film and monitor electrode 16 of the monitor region are formed by patterning.

The method for evaluating a semiconductor device according to the present invention first applies a bias voltage Vg (Vg=1.2 V) to the reference electrode 20 of the reference region 18 and measures a leakage current value Ig1 in Step ST1 shown in FIG. 6. The measurement is performed in each of a plurality of the reference regions 18 formed with the reference insulating films having different thickness values Tox1.

Figure 7A:
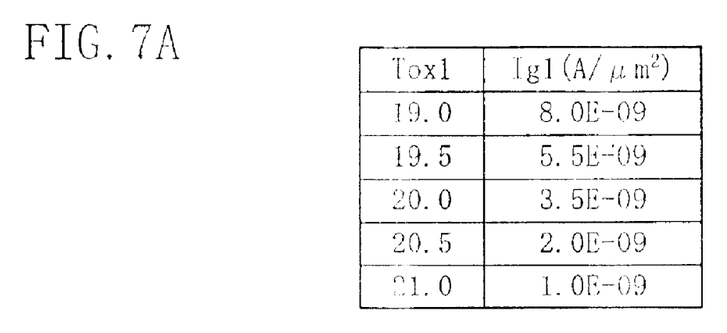
FIGS. 7A and 7B are a tabular view and a graph each showing the relationship between a leakage current value Ig1 and the film thickness value Tox1 of a reference insulating film in the reference region.
Figure 7B:
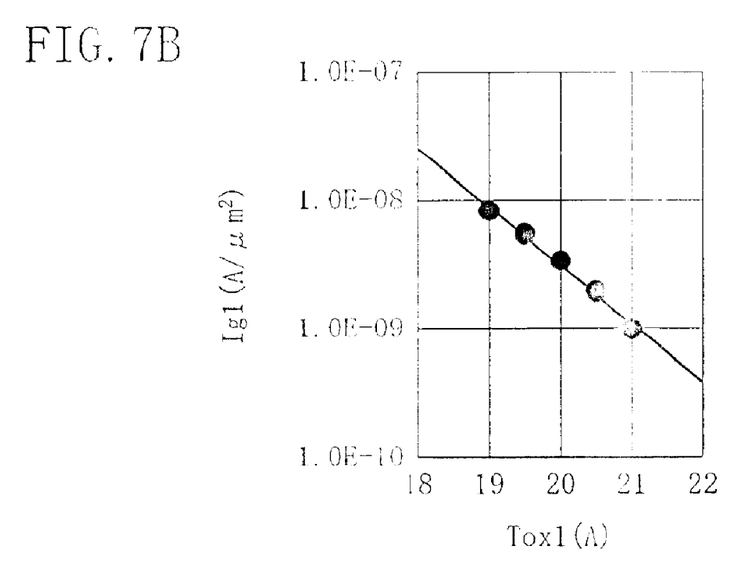

FIGS. 7A and 7B are a tabular view and a graph each showing a relationship between the leakage current value Ig1 measured in Step ST1 of FIG. 6 and the thickness value Tox1 of the reference insulating film. From the drawings, it will be understood that the leakage current value Ig1 decreases as the reference insulating film is thicker and the leakage current value Ig is determined uniquely by the thickness of the insulating film.

Next, in Step ST2 of FIG. 6, a bias voltage Vg=1.2 V is applied to the monitor electrode 16 and a leakage current value Ig2 flowing between the monitor electrode 16 and the channel region of the substrate 10 is measured. As shown in FIG. 5A, the measurement was performed by measuring the leakage current value Ig2 in each of the plurality of chips A to I under evaluation.

Since the area of the monitor insulating film in the monitor region 13 is large, variations in leakage current value resulting from area variations can be ignored. Hence, the variations in leakage current value Ig2 at 9 points are attributable to the thickness of the monitor insulating film.

Next, in Step ST3 of FIG. 6, the thickness value Tox2 of the monitor insulating film is calculated by comparing the leakage current value Ig2 in the monitor region 13 with the leakage current value Ig1 in the reference region 18. Since the monitor insulating film and the gate insulating film are formed in close proximity, they can be considered to have nearly the same film thicknesses. This allows the thickness of the gate insulating film to be obtained.

Figure 8:
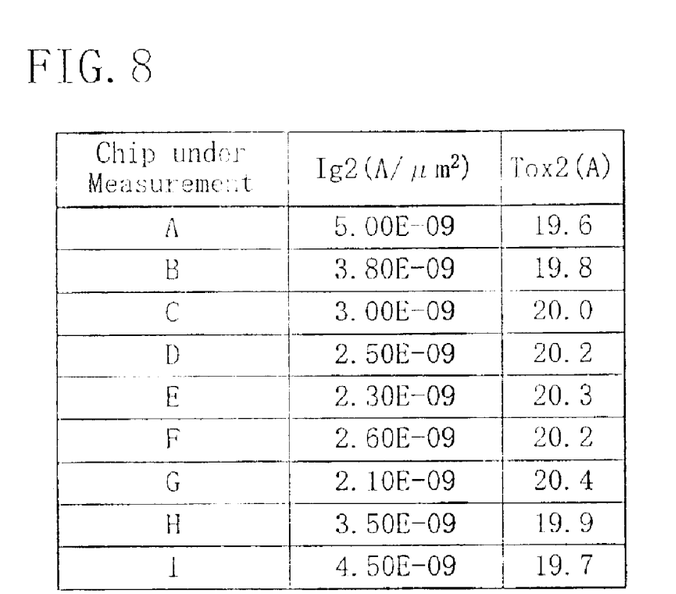
FIG. 8 is a tabular view showing a leakage current value Ig2 and the calculated film thickness value Tox2 of a monitor insulating film in a monitor electrode.

FIG. 8 is a tabular view showing the leakage current value Ig2 and the calculated thickness Tox2 of the monitor insulating film. As shown in FIG. 8, variations are observed in the leakage current value Ig2 of each of the chips A to I under evaluation. The variations are presented as variations in the thickness value Tox2 of the monitor insulating film. This makes it also possible to individually obtain the film thickness of the monitor insulating film of each of the chips 11 under evaluation.

Next, in Step ST4 of FIG. 6, a bias voltage Vg (Vg=1.2 V) is applied to the gate electrode 15 of the transistor 17 and a leakage current value Ig3 flowing between the gate electrode 15 and the channel region of the substrate 10 is measured. The measurement was performed by measuring the leakage current value Ig3 in each of a plurality of the chips A to I under evaluation.

In each of the chips A to I under evaluation, the respective thicknesses of the monitor insulating film and the gate insulating film are set to the same value (set film thickness value). Even if variations due to errors are observed, the monitor insulating film and the gate insulating film can be considered to have nearly the same film thicknesses. Accordingly, the magnitude of the leakage current can be considered to have a correlation with the area of each of the insulating film and the electrode so that the area of each of the gate insulating film and the gate electrode 15 can be obtained through a comparison between the leakage current value Ig2 measured in Step ST2 and the leakage current value Ig3 measured in Step ST4.

Figure 9:
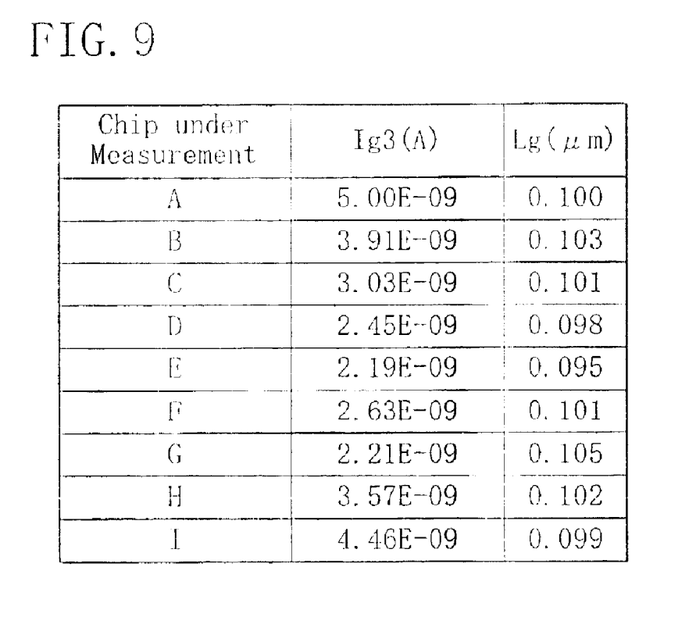
FIG. 9 is a tabular view showing a leakage current value Ig3 and the value of a calculated gate length value Lg in an actual transistor region.

Thus, the dimensions of the gate electrode 15 are calculated in Step ST5 of FIG. 6 by comparing the leakage current value Ig2 (leakage current value per unit area) and the leakage current value Ig3 with each other. FIG. 9 is a tabular view showing the leakage current value Ig3 and the calculated gate length value Lg. The gate length value Lg has been calculated by using the gate width value Lw (Lw=10 $\mu$m) of the gate electrode 15.

Thus, the present embodiment allows accurate measurement of the thickness of the gate insulating film by using the large-area monitor electrode 16 in which an area error can be ignored and further allows measurement of the dimensions of the gate electrode 15. Since evaluation can be performed at any point in the wafer 10 under evaluation, variations in the thickness of the gate insulating film and in the dimensions of the gate electrode 15 can be obtained easily at any portion of the wafer 10.

In the present embodiment, it is also possible to measure the leakage current value in the monitor region 13 in Step ST2, compare the measured leakage current value with the leakage current value Ig1 in the reference region 18 in Step ST3, thereby calculate the thickness of the gate insulating film of the transistor 17, and completing the step.

Embodiment 3

Figure 10:
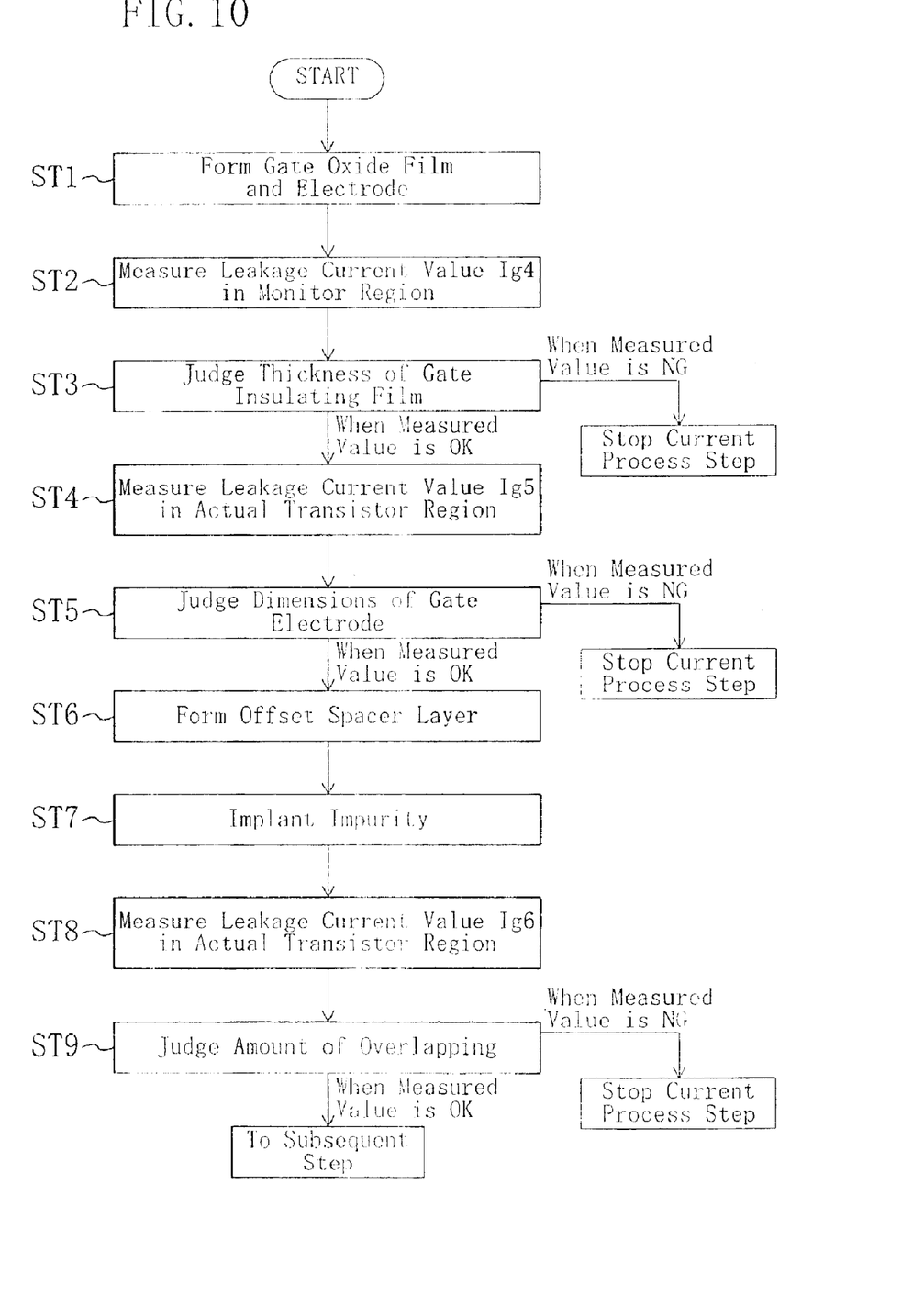
FIG. 10 is a flow chart illustrating a method for fabricating (evaluating) a semiconductor device according to a third embodiment of the present invention.

The present embodiment will describe a method for fabricating a semiconductor device, while evaluating it in the course of the fabrication process therefor with reference to FIGS. 5B and 10. FIG. 10 is a flow chart illustrating the method for fabricating (the method for evaluating) a semiconductor device according to the third embodiment. The semiconductor device fabricated in the present embodiment has the same structure as the structure shown in FIG. 5B according to the second embodiment.

In accordance with the method for fabricating a semiconductor device according to the present embodiment, a silicon oxide film with a set thickness of 2.2 nm and a polysilicon film with a thickness of 160 nm are formed first on a substrate 10 and patterned in Step ST1 shown in FIG. 10 such that a semiconductor device as shown in FIG. 5B is obtained. As a result, an actual transistor region 12 is formed with a gate insulating film (not shown) and a gate electrode 15, while a monitor region 13 is formed with a monitor insulating film (not shown) and a monitor electrode 16.

Next, in Step ST2, a bias voltage Vg (Vg=1.2 V) is applied to the monitor electrode 16 shown in FIG. 5B and a leakage current value Ig4 is measured.

Next, in Step ST3, it is judged whether or not the thickness of the gate insulating film is in a normal range by using the leakage current value Ig4. This is because the thickness of a gate insulating film actually formed deviates from the set value and therefore it is necessary to judge whether a thickness variation is in a permissible range. A description will be given to a specific method.

Figure 11:
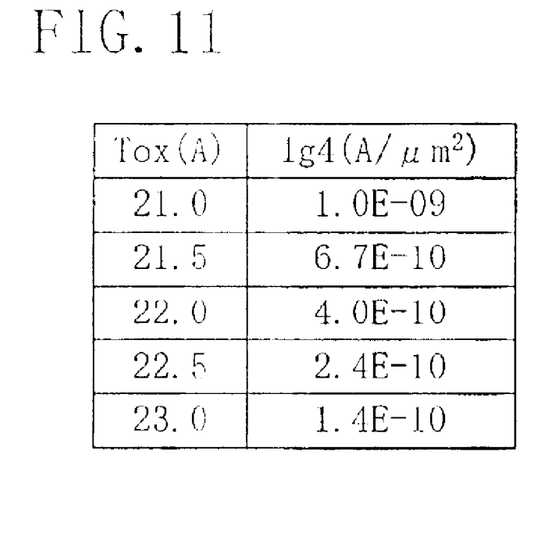
FIG. 11 is a tabular view showing the film thickness value Tox of a reference insulating film and a leakage current value Ig4 in the reference region.

A correlation between leakage current value and reference insulating film is preliminarily calculated by using the reference region which is in the same state as the monitor region 13 in Step ST2. FIG. 11 is a tabular view showing the film thickness value Tox of the reference insulating film of the reference region and the leakage current value Ig4. From FIG. 11, it will be understood that the leakage current value corresponding to the set thickness of the gate insulating film, which is 2.2 nm, is $4\times10^{-10}$ A/$\mu$m$^2$. If the normalized value of the actually measured thickness of the gate insulating film is assumed to be 2.2±0.5 nm, the normalized value of the leakage current ranges from $2.4\times10^{-10}$ to $6.7\times10^{-10}$ A/$\mu$m$^2$.

Whether or not the leakage current value Ig4 measured in Step ST2 is in the range of the normalized values of the leakage current determines whether or not the thickness of the monitor insulating film is in the permissible range is determined. Since the monitor insulating film has such a large area as to render an area error ignorable, the correspondence between film thickness and leakage current can be determined precisely. Since the monitor insulating film and the gate insulating film have nearly the same thickness values, the thickness value of the gate insulating film can be judged. If the result of judgment is OK, the whole process advances to Step ST14. If the result of judgment is NG, on the other hand, the whole process stops.

Next, in Step ST4, a bias voltage Vg (Vg=1.2 V) is applied to the gate electrode 15 and a leakage current value Ig5 is calculated.

Next, in Step ST5, it is judged whether or not the dimensions of the gate electrode 15 is normal by comparing the leakage current value Ig5 and the leakage current value Ig4 obtained in Step ST2 with each other. The following is a specific method.

The leakage current value and the electrode area value has a correlation therebetween. This makes it possible to compare the area of the monitor electrode 16 with the set area of the gate electrode 15 and predict the leakage current value Ig5 in the gate electrode 15 from the leakage current value Ig4 in the monitor electrode 16. A permissible range of areas considering variations is set based on the set area of the gate electrode 15 and the normalized value of the leakage current Ig5 corresponding to the range of areas is obtained.

Whether or not the leakage current value Ig5 measured in Step ST4 is in the range of normalized values determines whether or not the dimensions of the gate electrode 15 is in the permissible range. If the result of judgment is OK, the whole process advances to Step ST6. If the result of judgment is NG, on the other hand, the whole process stops.

Next, in Step ST6, a HTO film with a thickness of 14 nm is formed over the gate electrode 15 and the side surfaces of the gate insulating film and subjected to dry etching so that an offset spacer layer with a thickness of about 10 nm is formed. As described in the first embodiment, an amount of overlapping between the gate electrode 15 and impurity diffusion layers formed subsequently can be adjusted by adjusting the film thickness of the offset spacer layer. Since various characteristics including a short-channel effect, a gate overlap capacitance, and a driving force change depending on the amount of overlapping, the amount of overlapping is adjusted in consideration of these characteristics.

Next, in Step ST7, an impurity is ion-implanted into the wafer 10. SD extension diffusion layers are formed by, e.g., implanting As into the portions of the wafer 10 located on both sides of the gate electrode 15 under conditions such that an implant energy is 3 KeV and a dose is $1.5 \times 10^{15}$ cm$^{-2}$. Then, the steps of forming a side wall on the side surfaces of the offset spacer layer and forming and activating the source/drain diffusion layers are performed, whereby the transistor 17 is formed.

Next, in Step ST8, a leakage current value Ig6 in the transistor 17 shown in FIG. 5B is measured.

Next, in Step ST9, it is judged whether or not the amount of overlapping is in a proper range by using the leakage current value Ig6. The judgment is performed to examine whether or not the amount of overlapping has been controlled normally by adjusting the film thickness of the offset spacer layer in Step ST17. A specific method will be described below.

Figure 12:
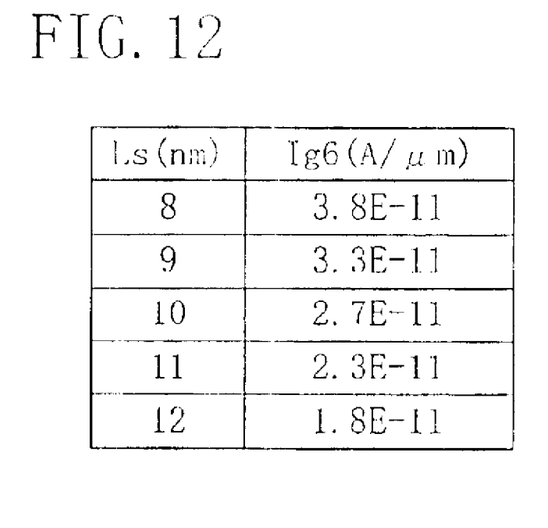
FIG. 12 is a tabular view showing a leakage current value Ig6 and the film thickness value Ls of an offset spacer layer in the reference region.

A correlation between leakage current value and film thickness of offset spacer layer is preliminarily calculated by using a reference region in the same state as the transistor 17 in Step ST8. FIG. 12 is a tabular view showing the leakage current value Ig6 and the film thickness value Ls of the offset spacer layer in the reference region. From FIG. 12, it will be understood that the leakage current value corresponding to the film thickness value of the offset spacer layer, which is 10 nm, is $2.7 \times 10^{-11}$ A/$\mu$m. If the normalized value of the film thickness of the offset spacer layer formed actually is assumed to be 10±1 nm, the normalized value of the leakage current ranges from $2.3 \times 10^{-11}$ to $3.3 \times 10^{-11}$ A/$\mu$m.

Whether or not the leakage current value Ig6 measured in Step ST8 is in the range of the normalized values of the leakage current determines whether or not the film thickness of the offset spacer layer is in a permissible range. Since the amount of overlapping corresponds to the film thickness of the offset spacer layer, the amount of overlapping can be judged. If the result of the judgment is OK, the whole process advances to the subsequent step. If the result of the judgment is NG, on the other hand, the whole process stops.

In accordance with the method for fabricating a semiconductor device according to the present embodiment, whether or not a process is proper can be judged in the course of the process steps. The method prevents a product which has proved to be faulty in the course of a process step from flowing into the subsequent process steps and thereby achieves a cost reduction.

The present invention may also perform Step ST9 after the formation of the SD extension diffusion layers and prior to the formation of the sidewall and the source/drain diffusion layers. In that case, the judgment performed in the reference region may be performed appropriately under the same conditions used for the chip under judgment.

Although each of the foregoing embodiments has performed the judgment of the thickness of the gate insulating film in Step ST3, performed the judgment of the dimensions of the gate insulating film in Step ST5, and performed the judgment of the amount of overlapping in Step ST9, it is also possible to perform either one of the judgments or only two thereof in accordance with the present invention.

What is claimed is:

1. A method for evaluating a semiconductor device having a gate insulating film provided on a semiconductor layer, a gate electrode provided on the gate insulating film, an offset spacer layer provided on a side surface of the gate electrode, and an impurity diffusion layer formed in the semiconductor layer by using the gate electrode and the offset spacer layer as at least part of a mask, the method comprising the steps of:

(a) measuring a plurality of leakage currents by using a plurality of semiconductor devices having the offset spacer layers with different film thicknesses; and (b) calculating a correlation between leakage current and film thickness of offset spacer layer based on the plurality of leakage currents.

2. The method of claim 1, wherein the step (b) includes calculating a film thickness value of the offset spacer layer when the leakage current value is zero based on the correlation and regarding the film thickness value as a length of a portion of the semiconductor layer extending from under an outer end of the offset spacer layer to an inner tip end of the impurity diffusion layer.

3. A method for fabricating a semiconductor device, the method comprising the steps of:

(a) forming a gate insulating film and a gate electrode on a semiconductor layer;

(b) forming an offset spacer layer on a side surface of the gate electrode;

(c) after the step (b), ion-implanting an impurity into a portion of the semiconductor layer by using, as a mask, the gate electrode and the offset spacer layer;

(d) after the step (c), measuring a leakage current between the gate electrode and the semiconductor layer; and (e) comparing the leakage current with a normalized value to judge whether or not a horizontal length of a portion of the semiconductor layer extending from under an outer end of the offset spacer layer to a tip end of a region of the semiconductor layer in which the impurity implanted in the step (c) is diffused is proper.

4. A method for evaluating a semiconductor device having an actual operating element comprising a gate insulating film provided on a semiconductor layer, a gate electrode provided on the gate insulating film, an offset spacer layer provided on a side surface of the gate electrode, and an impurity diffusion layer formed in the semiconductor layer by using the gate electrode and the offset spacer layer as at least part of a mask, the method comprising the steps of:

(a) measuring respective leakage currents in some of a plurality of reference elements having respective reference offset spacer layers with different film thicknesses;

(b) calculating a correlation between leakage current and film thickness of reference offset spacer layer based on the respective leakage currents in the reference elements; and (c) evaluating, based on the correlation, a length of a portion of the semiconductor layer extending from under an outer end of the offset spacer layer to the impurity diffusion layer in the actual operating element.

5. The method of claim 4, wherein the step (b) includes calculating, based on the correlation, the film thickness value of each of the reference offset spacer layers when the reference leakage current has a zero value and the step (c) includes regarding the film thickness value as the length of the portion of the semiconductor layer extending from under the outer end of the offset spacer layer to a tip end of the impurity diffusion layer in the actual operating element.

6. The method of claim 4, wherein a wafer formed with the actual operating element is provided with an actual transistor region in which the actual operating element is provided and with a monitor region having a monitor insulating film and a monitor electrode, the monitor insulating film being formed from a film from which the gate insulating film is formed to have an area larger than an area of the gate insulating film, the method further comprising the steps of:

(d) prior to the step (a), after the gate insulating film of the actual operating element and the gate electrode thereof are formed and before the impurity diffusion layer is formed, measuring a leakage current in the monitor region;

(e) calculating a thickness of the monitor insulating film based on a correlation between the leakage current and the monitor insulating film in the monitor region; and (f) regarding the thickness of the monitor insulating film as a thickness of the gate insulating film of the actual operating element.

7. The method of claim 6, further comprising the steps of:

(g) prior to the step (e), measuring respective leakage currents in some of a plurality of reference regions having respective reference insulating films with different thicknesses; and (h) calculating, based on the respective leakage currents in the reference regions, a correlation between leakage current and thickness of reference insulating film.

8. The method of claim 4, further comprising the steps of:

(i) measuring a leakage current in the actual transistor region; and (j) comparing the leakage current measured in the step (i) with the leakage current measured in the step (g) to calculate a dimension of the gate electrode of the actual operating element.

9. The method of claim 6, wherein the area of the monitor insulating film is 100 times the area of the gate insulating film or more.

* * * * *